United States Patent
Young et al.

(10) Patent No.: US 10,923,188 B2
(45) Date of Patent: Feb. 16, 2021

(54) MACRO STORAGE CELL COMPOSED OF MULTIPLE STORAGE DEVICES EACH CAPABLE OF STORING MORE THAN TWO STATES

(71) Applicant: Intel Corporation, Santa Clara, CA (US)

(72) Inventors: Ian A. Young, Portland, OR (US); Dmitri E. Nikonov, Beaverton, OR (US); Elijah V. Karpov, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/457,987

(22) Filed: Jun. 29, 2019

(65) Prior Publication Data
US 2020/0411088 A1    Dec. 31, 2020

(51) Int. Cl.
*G11C 13/00*    (2006.01)

(52) U.S. Cl.
CPC ........ *G11C 13/004* (2013.01); *G11C 13/0069* (2013.01); *G11C 2013/0054* (2013.01)

(58) Field of Classification Search
CPC ............... G11C 13/004; G11C 13/0002; G11C 13/0069; G11C 2013/0054; G11C 15/046
See application file for complete search history.

(56) References Cited

U.S. PATENT DOCUMENTS

| | | | |
|---|---|---|---|
| 2004/0125646 A1* | 7/2004 | Durlam | G11C 11/16 365/158 |
| 2014/0153310 A1* | 6/2014 | Sekar | G11C 15/046 365/49.15 |
| 2019/0355895 A1* | 11/2019 | Song | H01L 43/10 |

* cited by examiner

Primary Examiner — David Lam
(74) Attorney, Agent, or Firm — Compass IP Law PC

(57) ABSTRACT

An apparatus. The apparatus includes a macro storage cell having a first storage device and a second storage device. The first and second storage devices each able to store more than two states. The macro storage cell to store multiple values resulting from a combination of the respectively stored states of the first and second storage devices.

20 Claims, 7 Drawing Sheets

Fig. 6a (side view)
Fig. 6b (side view)
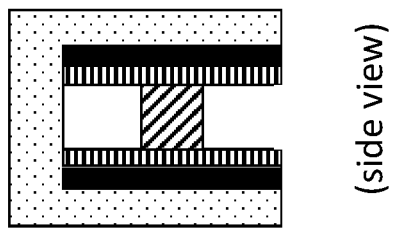
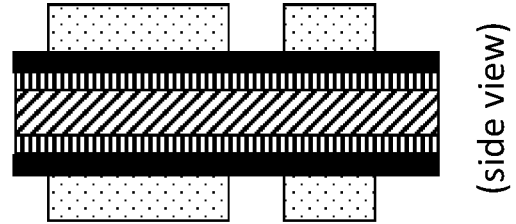
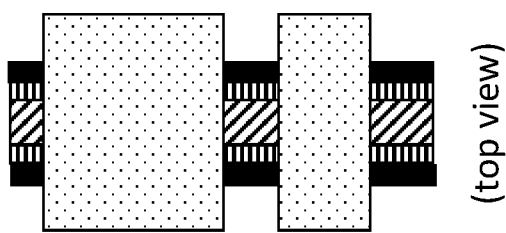 (top view)
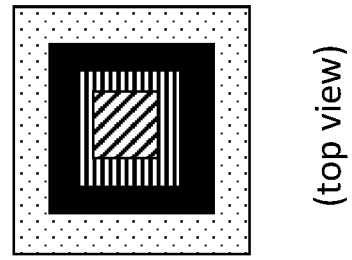 (top view)
Channel Material 
Gate Material 
Interlayer Oxide 
Ferroelectric 

MACRO STORAGE CELL COMPOSED OF MULTIPLE STORAGE DEVICES EACH CAPABLE OF STORING MORE THAN TWO STATES

FIELD OF INVENTION

The field of invention pertains generally to the electronic arts, and, more specifically, to a macro storage cell composed of multiple storage devices each capable of storing more than two states.

BACKGROUND

As computing systems continue to implement increasingly complex functions, memory systems and their underlying technology are increasingly becoming a bottleneck. That is, the logic used to process the data of complex functions are increasingly waiting to receive data from memory to operate on, and/or, are waiting for newly created output data to be written to memory before a next set of input data can be operated on.

FIGURES

A better understanding of the present invention can be obtained from the following detailed description in conjunction with the following drawings, in which:

FIGS. 6a and 6b show the storage devices of a macro cell arranged laterally and vertically, respectively.

DETAILED DESCRIPTION

A number of emerging applications, such as artificial intelligence, machine vision, etc. could be implemented more efficiently if some kind of multi-value memory were available. For instance, in the case of artificial intelligence, nodes of a neural network are interconnected by weights. The impact of a preceding node's output on the mathematical computation of a following node is set by a numerical weight value. Here, in order to have a wide dynamic range of available weights for any particular node to node connection, a memory cell that is capable of storing multiple values per cell (e.g., at least 20) would be useful.

That is, for example, each node to node connection is coupled to such a cell and the cell stores a value that corresponds to the weight that is assigned to the connection. With a cell that is capable of storing any of multiple possible values a wide range of weights could be assigned to a node to node connection. In the case of machine vision, for example, a similar cell could be used, e.g., to store pixel intensity values, etc.

Given that multiple emerging applications would perform better with memory cells that are able to store a wide range of stored values per memory cell rather than only a single bit or just a few bits (less than 10), the present application is directed to a particular memory cell (a "macro value cell" or "macro cell") that is capable of storing many (e.g., at least 20) stored values per cell.

Figure 1:
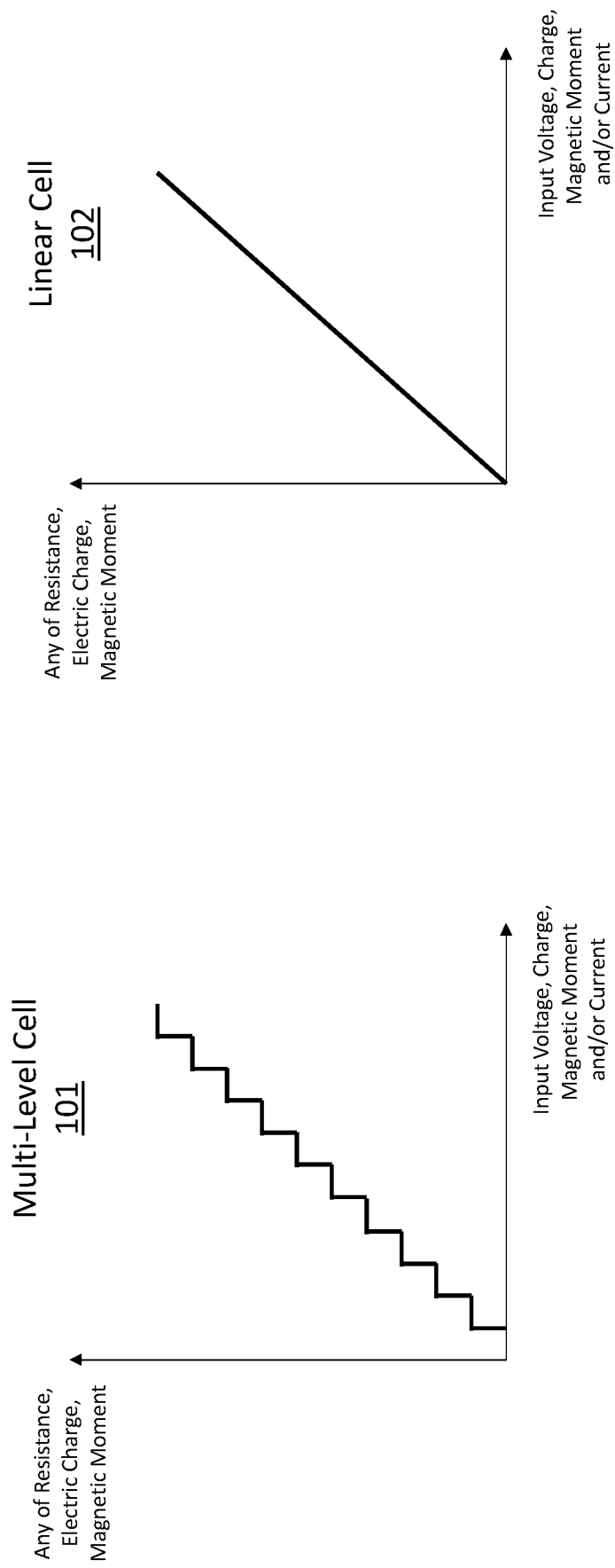
FIG. 1 shows characteristic curves for different types of storage devices.

FIG. 1 shows the characteristics of two different types of storage devices. A first type of memory cell 101, referred to as a multi-level cell, is discrete in its operation in that the cell stores separate and distinct states. Here, as can be seen in inset 101, the cell stores discrete levels (e.g., of charge, resistance, magnetic dipole moment, electric dipole moment, etc.) as a function of an applied input signal. A flash memory is a type of multi-level cell in that it can store different amounts of charge in a single cell to effectively store multiple bits per cell (e.g., a flash cell that can store four different levels of charge is viewed as being able to store any of four different multi-bit logical states: 00, 01, 10, 11). A single flash memory cell, however, is not currently able to store enough levels to effect, by itself, true macro value cell operation (leading edge flash cells can currently only store sixteen different states per flash cell).

A second type of memory cell, referred to as a linear cell, exhibits a continuous (referred to as "linear") relationship between its stored state (e.g., of charge, resistance, magnetic dipole moment, electric dipole moment, etc.) and the input signal. That is, across a continuous range of input signals, the stored state of the device is continuous in response. Ferroelectric memory cells, as just one example, exhibit linear behavior if the cell's electric dipole moment simply grows in response to an increasing input signal.

Regardless of whether a multi-level or linear cell is implemented, however, currently no commercially manufacturable single cell is capable of storing enough values to effect true macro level storage.

Figure 2:
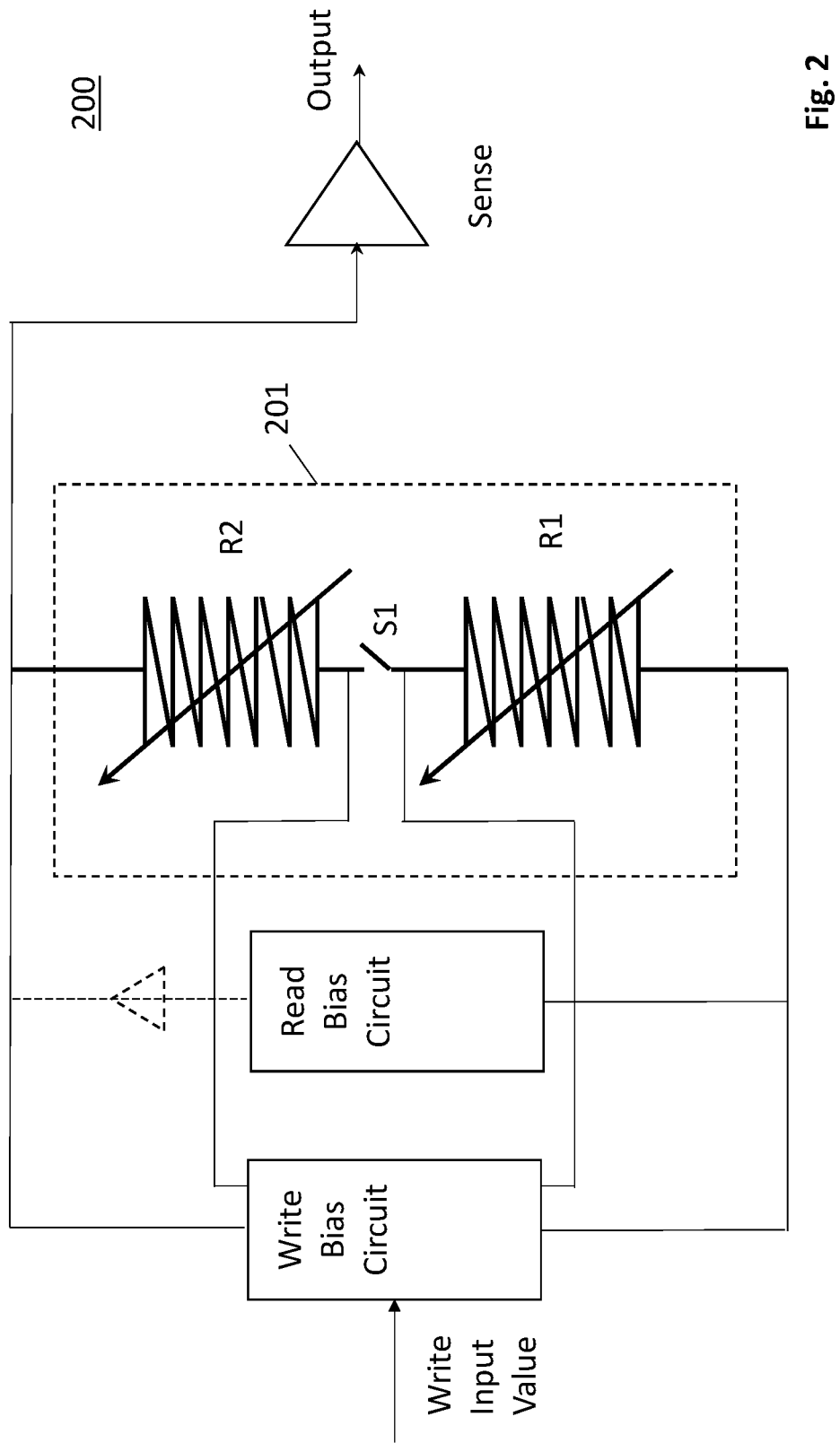
FIG. 2 shows an embodiment of a macro cell.

As such, FIG. 2 shows a design for a macro level cell 200 whose storage element 201 is constructed from more than one multi-value and/or linear resistive cell to effect macro level operation for the entire cell. For ease of discussion the discrete cells in the storage element 201 are presumed to be resistive in nature (their different stored states are reflected in different resistances of the cells), although other implementations may choose to store some other physical phenomenon (e.g., charge, magnetic dipole moment, etc.).

As observed in FIG. 2, the macro level cell 200 also includes some form of sense circuitry to detect the value that is stored in the storage element 201, some form of read bias circuitry to bias the storage element 201 during the read, and some form of write bias circuitry to write a received input value into the storage element 201. As depicted the sense element is shunted with the storage element (e.g., to detect a voltage across the storage element 201 when it is driven with a fixed current by the read bias circuitry), however, other elements may choose to place the sense element in series with the storage element (e.g., to detect a current that flows through the storage element 201 when the read bias circuit applies a fixed voltage across the storage element 201).

In the particular example of FIG. 2, two resistive multi-level devices are arranged in series. If the first device R1 is capable of storing N different resistive states, and the second device R2 is capable of storing M different resistive states, then, there are theoretically NM different achievable resistance values that can be observed through the terminals of the storage element ($N^2$ if both devices store N different resistance states).

That is, e.g., for a particular read/sense current $I_{SENSE}$, the read voltage $V_{READ}$ across the cell will be $$V_{READ} = IR_{TOT}$$

where $R_{TOT} = R1+R2$. If no two different pair of R1 and R2 settings result in a same resistance, then, $R_{TOT}$ can have any of NM different values. Thus, for example, if each of R1 and R2 can be set to any of 8 different resistances, then the total resistance through the overall storage element 201 can have any of 64 different possible resistance settings. These 64 different resistance values can then be used to effect macro cell operation, e.g., in any of the applications mentioned above.

Here, in order to write these values into the macro cell, the write circuitry, in various embodiments is able to write to the R1 and R2 storage elements independently of one another (switch S1 is open). By contrast, during a read, the R1 and R2 storage elements are read together to provide the correct value at the output which derives from a combination of the respective states of R1 and R2 (switch S2 is closed).

In various embodiments, in order to help prevent different pairs of R1 and R2 settings result in a same or indistinguishable total resistance of the macro cell (that is, in order to prevent resistance value "overlap"), one of the storage devices (e.g., R2) is designed to exhibit significantly larger resistance than the other storage device (e.g., R1). For example, if R2 is designed to exhibit resistance values that are 10× those of R1, R2 will act as "course" setting for the macro cell's resistance while R1 will act as a "fine" setting.

Figure 3:
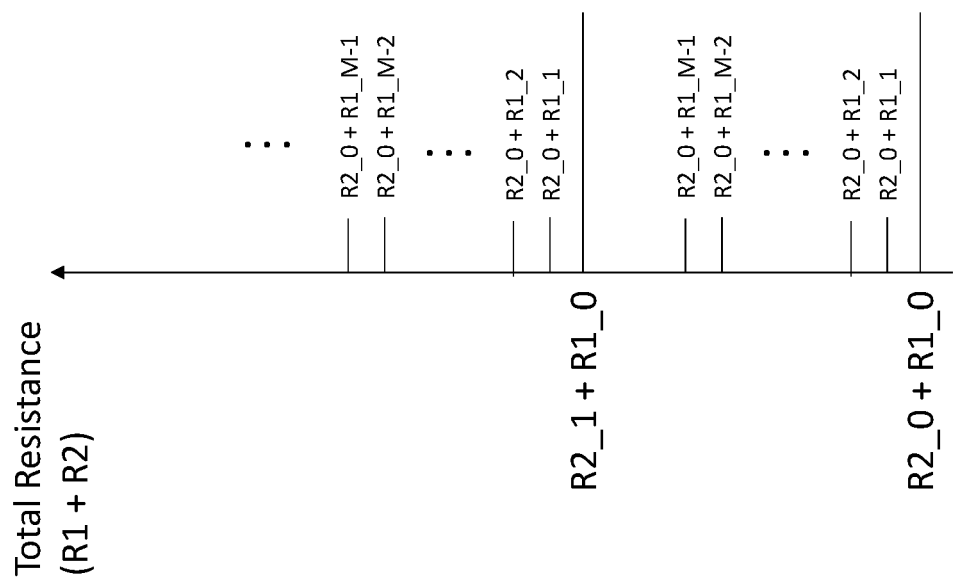
FIG. 3 shows different states of a macro cell derived from a combination of resistive states of the macro cell's respective storage devices.

FIG. 3 demonstrates an example of the spread of different total resistance values that may be observed through the storage cell if R2 is made larger than R1. Here, as can be seen, each setting of R2 (R2_0, R2_1, etc.) has a large scale effect on the storage element's resistance, while, the settings of R1 (R1_0, R1_1, etc.) correspond to modest increments in resistance above the base R2 setting. In terms of maximizing the different number of resistive states (i.e., minimizing resistance overlap), ideally (and as observed in FIG. 2), the increments in the R2 settings are larger than the full range of R1 settings.

In order to prevent resistance overlap each of the different combinations of R1 and R2 need to be sufficiently distinguishable. Thus, if R1 is used akin to a fine setting of the total resistance through the storage cell, the increments in R1 resistance (the difference in R1 resistance between two neighboring R1 settings) must be large enough to be easily sensed during a read and easily written during a write.

Larger R1 increments, however, tend toward a larger full range of R1 (which is equal to R1 increment size multiplied by the number of states of R1), which, in turn, results in more headroom that the R2 increments will need to clear above. Larger R1 increments therefore also tend toward fewer resistance states for R1 as compared to R2. That is, the more resistance states R1 has, the greater its full resistance range, which, in turn, makes for larger R2 increments.

Unfortunately, it should be easier to manufacture R1 and R2 elements having more comparable resistances and/or resistive increments. That is, the greater the ratio of R2 resistance to R1 resistance, the more likely R1 and R2 will be implemented as significantly different manufactured devices (which complicates manufacturing), while, the smaller the ratio of R2 to R1 resistance, the more likely R1 and R2 can be implemented as same/similar devices.

Here, it should be generally easier and/or lower cost to implement R2 and R1 more as same/similar devices than significantly different devices. For example, if R2 and R1 are manufactured as same/similar devices, their individual features may be formed entirely in parallel with R2 having a greater manufactured length than R1 to achieve larger R2 resistance as compared to R1. Furthermore, with the number of distinguishable states per device being one or the more pertinent manufacturing related achievements, various embodiments envision R1 and R2 having a same number of states even if R2 is designed to be greater than R1.

Thus, in various embodiments, R2 and R1 are essentially the same device in terms of manufactured features (e.g., other than length) and number of discrete states where R2 is no more than 6 times the size of R1 (e.g., R2 is in a range of 2 to 6 times as large as R1) in order to keep the overall size of the storage element small.

Keeping the ratio of R2 to R1 relatively small in this manner, there is some likelihood that different combinations of R1 and R2 will result in same/indistinguishable values of R1+R2 (some overlap is likely). If overlap exists, the number of different useable resistive states of the storage cell will decrease but, nevertheless, macro cell operation is still achievable (e.g., if a macro cell composed of a pair of 8 state devices has sixteen pairs of different settings that result in same/indistinguishable total resistance, the macro cell can still support at least 64−16=48 different resistance settings).

The design challenge of maximizing the number of different discernable resistance values exhibited by the storage element even though R1 and R2 are essentially similar devices can be addressed by defining a ratio of R2 to R1 ($R_{RAT}$) and defining the resistances of the two devices as $$R1 = R0^*(1:N)$$

$$R2 = R_{RAT}(R0^*(1:N))$$

Here, both devices have a core resistivity of R0 with R2 being made longer than R1 by a factor of RAT. Both devices have the same number of states N (the term (1:N) corresponds to one of any of N integer values).

Figure 4:
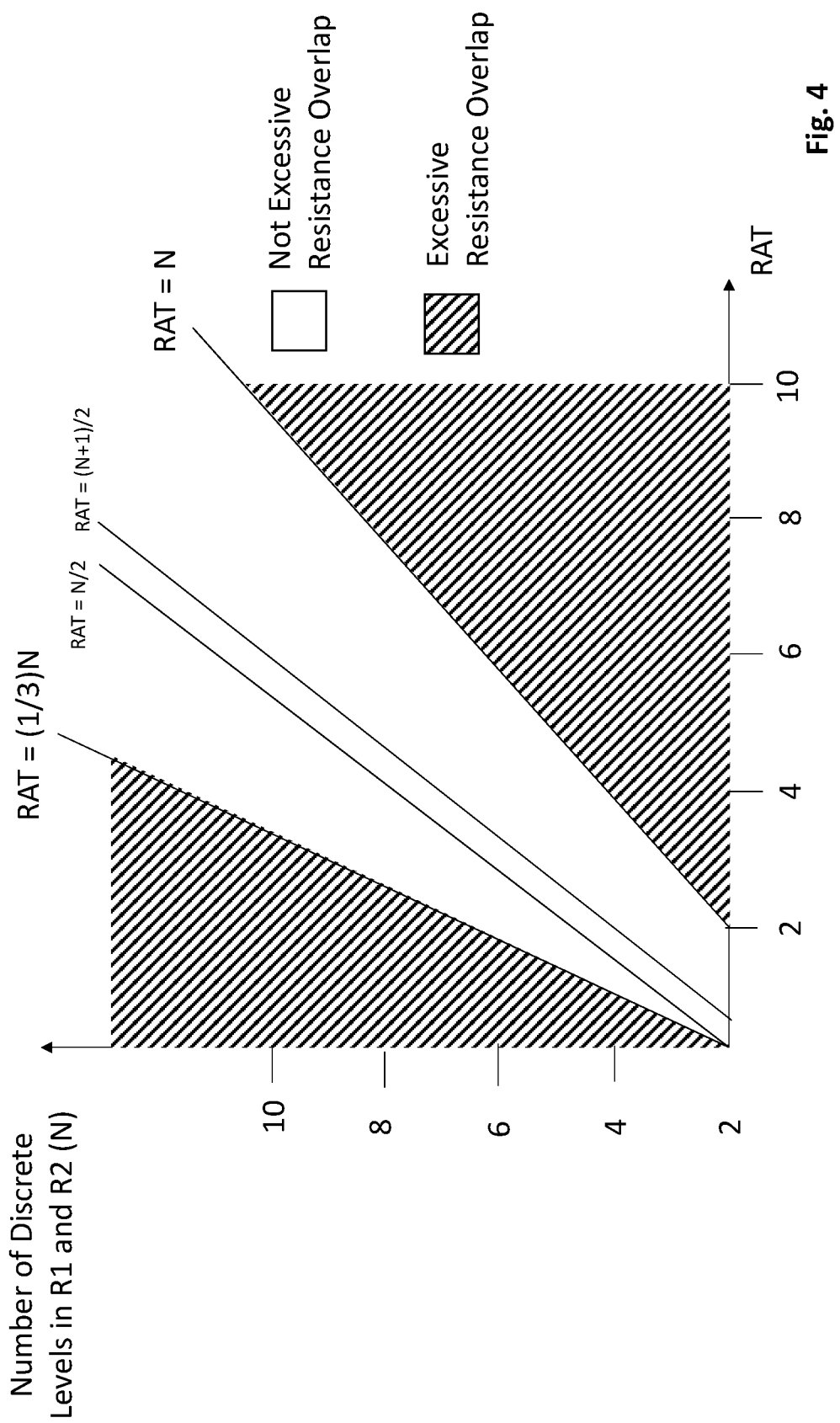
FIG. 4 shows a range of workable resistance ratios for the resistive storage devices of a macro cell as a function of the number of states that the resistance storage devices can store.

According to one analysis, looking at the devices as described just above, $R_{RAT}$ should be approximately N/2 if N is odd or (N+1)/2 if N is even. FIG. 4 provides a graph of resistance spacing (distance between resistance values) as a function of the number of resistance states and the resistance ratio. A wider range of optimal combinations of N and RAT are observed where RAT is less than or equal to N and greater than or equal to N/3.

As indicated above with respect to FIG. 2, various types of emerging non volatile storage cell devices may be candidates for the devices of the resistive channel 201 of the overall macro cell device 200. Candidate cells include but are not limited to ferroelectric cells (or ferroelectric transistors), phase change memory (PCM) cells, magnetic domain wall memory cells, oxygen vacancy resistive switching memory cells, conductive bridge resistive switching memory cells, etc. Each individual cell may be a three terminal device or a two terminal device (e.g., a PCM cell is generally implemented as a three terminal device while the other cells listed above are generally implemented as two terminal devices).

Additionally such cells may be linear cells or discrete multi-level cells as discussed above with respect to FIG. 1. Here, for example, PCM cells are programmed with different material phase states and are generally considered to be multi-level cells. Ferroelectric transistors can be constructed with multiple gates. Here, each time a gate is turned on or off the transconductance of the transistor exhibits a discrete change. As such, the ferroelectric transistor can be operated in a discrete fashion. A single channel and gate of a ferroelectric transistor, however, exhibits more traditional linear behavior of a single transistor. Therefore a ferroelectric transistor can operate as a discrete or linear device depending on implementation.

Figure 5:
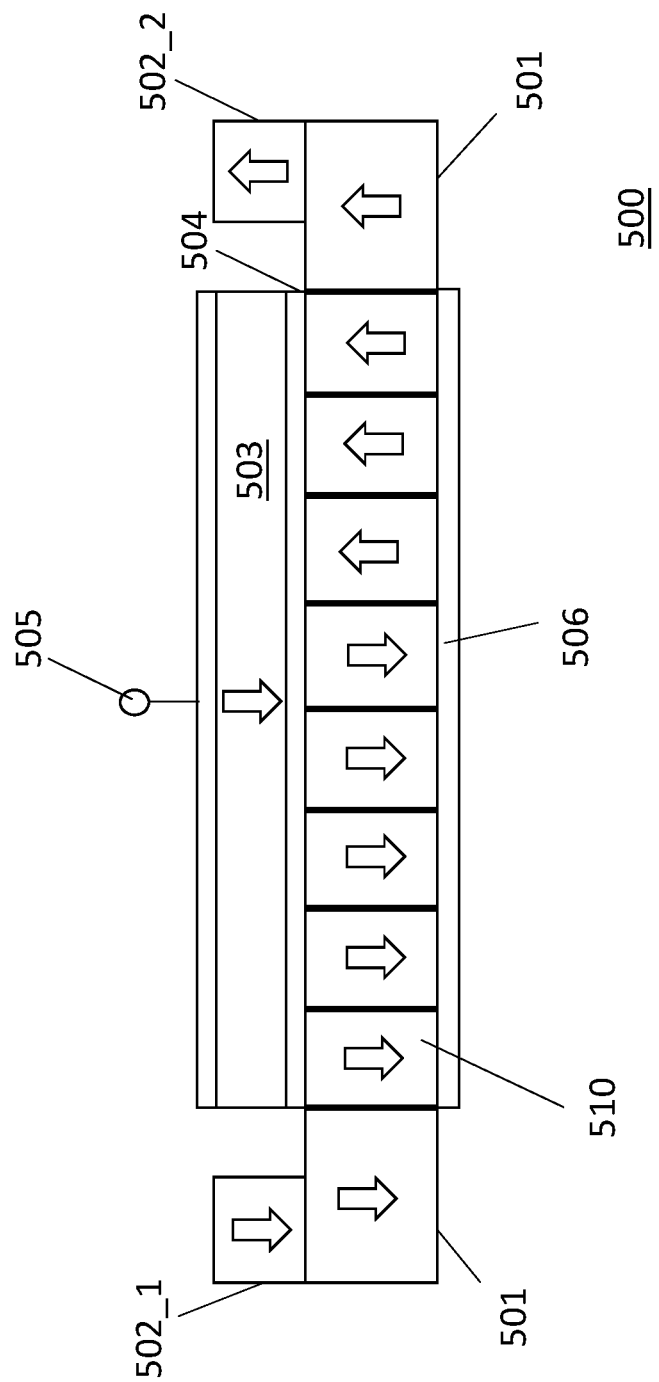
FIG. 5 shows a racetrack like multi value memory cell.

FIG. 4 shows a high level view of a magnetic domain wall memory device 500 that can operate as a multi-level resistive device for use in a macro cell as described above with respect to FIG. 2 (e.g., the single structure of FIG. 4 can operate as one of R1 and R2 in FIG. 2). The device 500 includes a ferromagnetic or ferrimagnetic (e.g., permalloy, alloys of Cobalt (Co), Nickel (Ni), Iron (Fe) including but not limited to any such alloys that also include any of Boron (B), oxide, Heusler alloys and/or transition metal oxides) channel or wire 501 that keeps magnetic domains that are purposely written into the device 500 (FIG. 5 only labels one such domain 510 for ease of drawing but FIG. 5 shows eight such domains being kept by the device).

A write head 502 is constructed from two different magnetic elements 502_1 and 502_2 that are positioned on opposite ends of the storage channel 501 of the device 500. Here, a first element, referred to as the "down" write head 502_1 has its magnetic moment set in the "down" direction and influences the magnetic moment of the channel 501 beneath it in the down direction. A second element, referred to as the "up" write head 502_2 has its magnetic moment set in the "up" direction and influences the magnetic moment of the channel 501 beneath it in the up direction. Both of write heads 502_1, 502_2 are composed of magnetic material (e.g., permalloy or any alloy of Ni or Fe or both Ni and Fe) so that their magnetic moments are strong enough to influence the magnetization direction of the respective regions of the lower channel 501 beneath them.

The bias of a voltage established across the write heads 502_1, 502_2 and the corresponding direction of current that flows through the channel 501 in response sets the specific combination of up and down magnetic domains that are stored in the channel 501. For instance, if the up head 502_2 is biased more positively than the down head 502_1 such that a current flows from the up head 502_2 to the down head 502_1 through the channel 501, domains whose magnetization direction is down will be written into the channel 501 from the left hand side of the channel 501 (from the down head 502_1 side of the device). By contrast, if the down head 502_1 is biased more positively than the up head 502_2 such that a current flows from the down head 502_1 to the up head 502_2 through the channel 501, domains whose magnetization direction is up will be written into the channel 501 from the right hand side of the channel 501 (from the up head 502_2 side of the device).

Thus, according to one embodiment, in a first state, all domains point in a first direction (e.g., "down"). In a second state, all domains but one point in the first direction (e.g., one "up" domain is written from the right side of the device after the device has been written into the first state described just above). In a third state, all domains but two are written in the first direction (e.g., two up domains are written from the right side of the device after the device has been written into the first state described just above).

The number of states therefore increments with each new domain that can be written in a direction opposite to the first direction when the device is in the first state. In the device of FIG. 5, starting from a first state in which all domains are pointed down, any of one to eight up domains can be entered on the right hand side of the device resulting in nine different states that the device can store. Although not depicted in FIG. 5, the region of the channel 501 that stores discrete domains may have special notches and/or diffusion locations to stabilize the positions of the walls of the stored domains within the device. An isolation layer 506 (e.g., $SO_2$) resides beneath the channel 501.

A read head 503 separated from the channel 501 by, e.g., a layer of Manganese Oxide (MgO) helps establish the resistivity of the device from a top electrode 506 through one (or both) of the write heads 502_1, 502_2 (alternatives to MgO include aluminum oxide (e.g., $Al_2O_3$) or silicon dioxide ($SiO_2$)). That is, during a read phase, a bias voltage is applied across electrode 505 and one or both of write heads 502_1, 502_2 and the resulting current is observed to determine the device's resistance (the lesser the observed current the higher the resistance, the greater the observed current the lesser the resistance).

Here, the resistance of the current path that travels through the channel 501 beneath the read head 503 and having stored therein a specific number of up domains and corresponding number of down domains will be different depending on the stored state within the channel 501. That is, for example, the resistance will be a maximum in the first state when all domains are in the down direction. Then, from this maximum resistance, the resistance will drop one increment with each up direction domain that is written from the right hand side of the device.

Note that this particular device does not necessarily possess more resistance as the length of the storage channel increases. Rather, the number of different states that the device can store increases as the length of the channel 501 increases.

By contrast, FIGS. 6a and 6b shows physical layout details for the storage element for a macro cell whose constituent R1 and R2 devices demonstrate increased resistance with their respective sizes/lengths. FIG. 6a shows laterally arranged R1 and R2 devices while FIG. 6b shows vertically arranged R1 and R2 devices. In the particular embodiments of FIGS. 6a and 6b, the devices can be viewed as ferroelectric devices where R2 is approximately three times that of R1 and therefore R2's length is approximately three times as long as R1's length.

Although embodiments above have stressed the use of resistive cells, other embodiments may hinge on other phenomena such as stored charge, stored magnetic dipole moment, store electro-static dipole moment, etc. that, with corresponding sense and write circuitry can be used to effectively store multiple values in a single device so that, e.g., two such devices can effect a macro cell capable of storing many values. For example, in the case of stored charge, flash cells may be utilized. Here, the above discussion of relative sizes, ratios etc. of different devices is still largely valid for macro cells that do not emphasize resistive storage cells.

Although embodiments above have stressed the use of first and second storage devices (e.g., a first storage device to implement R1 and a second storage device to implement R2), other embodiments may include more than two devices in order to store a large enough number of states to be deemed a macro cell.

Note that the topological diagrams of FIGS. 6a, 6b could easily be extended to include flash cells, e.g., by changing some materials and adding an extra layer.

Figure 7:
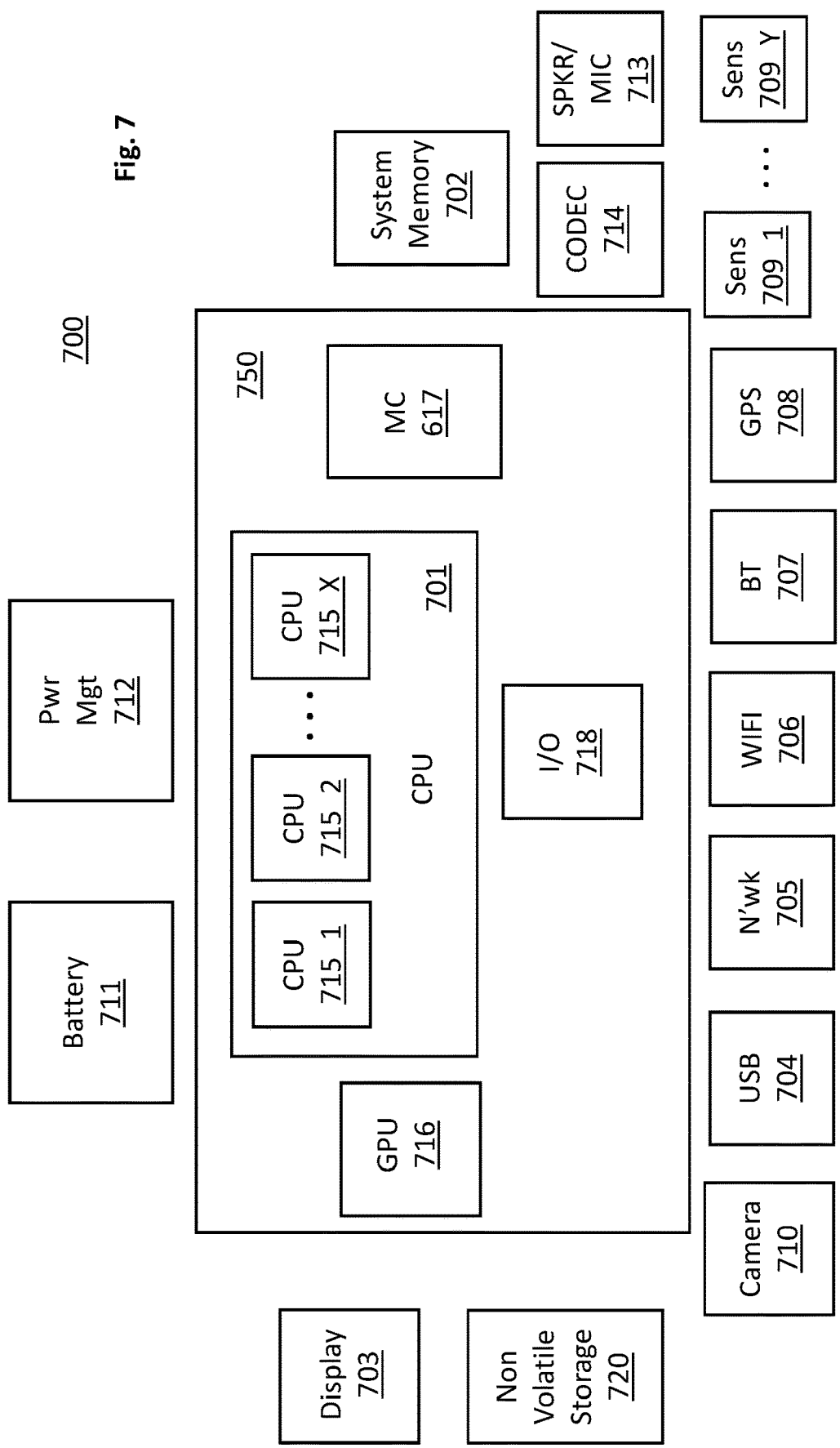
FIG. 7 shows a computing system.

FIG. 7 provides an exemplary depiction of a computing system 700 (e.g., a smartphone, a tablet computer, a laptop computer, a desktop computer, a server computer, etc.). As observed in FIG. 7, the basic computing system 700 may include a central processing unit 701 (which may include, e.g., a plurality of general purpose processing cores 715_1 through 715_X) and a main memory controller 717 disposed on a multi-core processor or applications processor, system memory 702, a display 703 (e.g., touchscreen, flat-panel), a local wired point-to-point link (e.g., USB) interface 704, various network I/O functions 705 (such as an Ethernet interface and/or cellular modem subsystem), a wireless local area network (e.g., WiFi) interface 706, a wireless point-to-point link (e.g., Bluetooth) interface 707 and a Global Positioning System interface 708, various sensors 709_1 through 709_Y, one or more cameras 710, a battery 711, a power management control unit 712, a speaker and microphone 713 and an audio coder/decoder 714.

An applications processor or multi-core processor 750 can be an SOC that includes one or more general purpose processing cores 715 within its CPU 701, one or more graphical processing units 716, a memory management function 717 (e.g., a memory controller) and an I/O control function or peripheral controller 718. The general-purpose processing cores 715 typically execute the operating system and application software of the computing system. The graphics processing unit 716 typically executes graphics intensive functions to, e.g., generate graphics information that is presented on the display 703.

The memory control function 717 interfaces with the system memory 702 to write/read data to/from system memory 702. The system memory (or main memory) 702 may be a multi-tiered memory having a faster, upper layer of volatile memory (e.g., DRAM) and a slower, layer of non volatile memory (e.g., NVRAM). As such, a system memory module having the features described at length above may be integrated into the system memory. Likewise, any co-processors (e.g., graphics processors) having local memory may use a multi-tiered local memory or at least NVRAM in the local memory. As such, the local memory may be composed of a module have the features described above.

Each of the touchscreen display 703, the communication interfaces 704-707, the GPS interface 708, the sensors 709, the camera(s) 710, and the speaker/microphone codec 713, 714 all can be viewed as various forms of I/O (input and/or output) relative to the overall computing system including, where appropriate, an integrated peripheral device as well (e.g., the one or more cameras 710). Depending on implementation, various ones of these I/O components may be integrated on the applications processor/multi-core processor 750 or may be located off the die or outside the package of the applications processor/multi-core processor 750.

The computing system also includes non-volatile storage 720 which may be the mass storage component of the system. Here, the non-volatile mass storage 720 may be implemented with one or more mass storage modules (e.g., SSDs) having the features described at length above.

The computing system may include macro cells as described above for implementing various functions (either in hardware, software or some combination thereof) such as but not limited to an artificial intelligence neural network, machine vision, etc.

Embodiments of the invention may include various processes as set forth above. The processes may be embodied in machine-executable instructions. The instructions can be used to cause a general-purpose or special-purpose processor to perform certain processes. Alternatively, these processes may be performed by specific/custom hardware components that contain hardwired logic circuitry or programmable logic circuitry (e.g., FPGA, PLD) for performing the processes, or by any combination of programmed computer components and custom hardware components. For example, a machine-readable storage medium may be used to store drawings of components described herein, and/or, of automated socket assembly/manufacturing processes described herein.

Therefore, elements of the present invention may also be provided as a machine-readable medium for storing the machine-executable instructions. The machine-readable medium may include, but is not limited to, floppy diskettes, optical disks, CD-ROMs, and magneto-optical disks, FLASH memory, ROMs, RAMs, EPROMs, EEPROMs, magnetic or optical cards, propagation media or other type of media/machine-readable medium suitable for storing electronic instructions. For example, the present invention may be downloaded as a computer program which may be transferred from a remote computer (e.g., a server) to a requesting computer (e.g., a client) by way of data signals embodied in a carrier wave or other propagation medium via a communication link (e.g., a modem or network connection).

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

The invention claimed is:

1. An apparatus, comprising:
a macro storage cell comprising a first storage device and a second storage device, the first and second storage devices each able to store more than two states, the macro storage cell to store multiple values resulting from a combination of the respectively stored states of the first and second storage devices, wherein, the first storage device is to store N different states and the second storage device is to store M different states, the first and second storage devices coupled in series with a switch residing between the first and second storage devices, the switch being open during a write so that the first and second storage devices are independently written to, the switch being closed during a read so that NM different states are readable from the macro storage cell.

2. The apparatus of claim 1 wherein the multiple values comprise at least 20 values.

3. The apparatus of claim 1 wherein the first and second storage devices both store resistive states.

4. The apparatus of claim 1 wherein one of the first and second storage devices demonstrates larger resistance than the other of the first and second storage devices.

5. The apparatus of claim 1 wherein the macro cell comprises:
an input to receive a value to be written into the macro storage cell; and,
write circuitry to write the value as a combination of states of the first and second storage devices.

6. The apparatus of claim 5 wherein the value is read from the macro storage cell as any of the following at an output of the macro storage cell:
a voltage;
a current;
an amount of charge;
a magnetic moment.

7. The apparatus of claim 1 wherein the first and second storage devices store magnetic domains separated by magnetic domain walls.

8. The apparatus of claim 1 wherein the first and second storage devices are arranged laterally with respect to one another.

9. The apparatus of claim 1 wherein the first and second storage devices are arranged vertically with respect to one another.

10. A computing system, comprising:
a plurality of processing cores;
a system memory;
a memory controller coupled between the plurality of processing cores and the system memory;
a network interface; and,
a macro storage cell comprising a first storage device and a second storage device, the first and second storage devices each able to store more than two states, the macro storage cell to store multiple values resulting from a combination of the respectively stored states of the first and second storage devices, wherein, the first storage device is to store N different states and the second storage device is to store M different states, the first and second storage devices coupled in series with a switch residing between the first and second storage devices, the switch being open during a write so that the first and second storage devices are independently written to, the switch being closed during a read so that NM different states are readable from the macro storage cell.

11. The computing system of claim 10 wherein the multiple values comprise at least 20 values.

12. The computing system of claim 10 wherein the first and second storage devices both store resistive states.

13. The computing system of claim 10 wherein one of the first and second storage devices demonstrates larger resistance than the other of the first and second storage devices.

14. The computing system of claim 10 wherein the macro cell comprises:
an input to receive a value to be written into the macro storage cell; and,
write circuitry to write the value as a combination of states of the first and second storage devices.

15. The computing system of claim 14 wherein the value is read from the macro storage cell as any of the following at an output of the macro storage cell:
a voltage;
a current;
an amount of charge;
a magnetic moment.

16. The computing system of claim 10 wherein the macro storage cell is a component of a neural network function of the computing system.

17. The computing system of claim 10 wherein the macro storage cell is a component of an image processor of the computing system.

18. A method performed by a macro cell, comprising:
receiving a value to be stored;
writing the value as a combination of states of multiple storage devices, the multiple storage devices in a series arrangement, a respective switch residing between each of neighboring ones of the multiple storage devices in the series arrangement, each of the multiple storage devices able to store more than two states, the writing being performed while the respective switch between each of the neighboring ones of the multiple storage devices is open so that the neighboring ones of the multiple storage devices are able to be independently written to;
reading the value from the macro cell, the reading being performed while the respective switch between each of the neighboring ones of the multiple storage devices is closed to effect a combined, series read of the multiple storage devices, the reading comprising sensing any of the following from a single output of the macro cell:
a voltage;
a current;
an amount of charge;
a magnetic moment.

19. The method of claim 18 wherein the more than two states further comprise more than two resistive states.

20. The method of claim 18 wherein the value is one of at least 20 different values that are writable into the macro cell.

* * * * *